(12) United States Patent
Kang

(10) Patent No.: US 12,506,445 B2
(45) Date of Patent: Dec. 23, 2025

(54) BIAS GENERATION CIRCUIT AND BUFFER CIRCUIT INCLUDING THE SAME

(71) Applicant: SK hynix Inc., Icheon-si (KR)

(72) Inventor: Ji Hyo Kang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 140 days.

(21) Appl. No.: 18/497,690

(22) Filed: Oct. 30, 2023

(65) Prior Publication Data
US 2024/0402736 A1 Dec. 5, 2024

(30) Foreign Application Priority Data

Jun. 2, 2023 (KR) .................... 10-2023-0071617

(51) Int. Cl.
*H03F 1/30* (2006.01)
*H03K 3/011* (2006.01)

(52) U.S. Cl.
CPC ............. *H03F 1/301* (2013.01); *H03K 3/011* (2013.01); *H03F 2200/447* (2013.01)

(58) Field of Classification Search
None
See application file for complete search history.

(56) References Cited

U.S. PATENT DOCUMENTS

| | | | | |
|---|---|---|---|---|
| 6,643,790 B1 * | 11/2003 | Yu | ............................ | H03K 5/151 327/175 |
| 6,661,728 B2 * | 12/2003 | Tomita | .................... | G11C 5/147 365/189.09 |
| 8,289,062 B2 * | 10/2012 | Lin | ......................... | H03H 11/26 327/158 |
| 8,508,307 B2 * | 8/2013 | Mitsuda | .................. | H03K 3/011 327/539 |
| 8,773,187 B2 * | 7/2014 | Lin | ......................... | H03K 5/131 327/158 |
| 9,316,542 B2 * | 4/2016 | Cao | ......................... | G01K 1/026 |
| 9,444,435 B1 * | 9/2016 | Monaco | ............... | H03K 3/0322 |
| 9,685,238 B2 * | 6/2017 | Gangasani | ........... | H03K 3/0231 |
| 10,972,049 B2 * | 4/2021 | Suwabe | .................. | H03F 1/301 |
| 2014/0049245 A1 | 2/2014 | Kim et al. | | |

(Continued)

FOREIGN PATENT DOCUMENTS

KR 1020100006782 A 1/2010

*Primary Examiner* — Thomas J. Hiltunen
(74) *Attorney, Agent, or Firm* — WILLIAM PARK AND ASSOCIATES LTD.

(57) ABSTRACT

The present technology may include: a control unit configured to generate two or more control signals in response to frequency information; a reference voltage generation unit configured to generate a first preliminary reference voltage and a second preliminary reference voltage; an amplification section configured to compare a first reference voltage and a second reference voltage with a feedback voltage and configured to output a result as a comparison signal; a voltage selection section configured to, in response to a first control signal, among the two or more control signals, selectively output the first preliminary reference voltage and the second preliminary reference voltage as the first reference voltage and the second reference voltage; and an output section configured to adjust a first current amount according to the comparison signal and configured to output a voltage corresponding to the first current amount as a bias voltage.

15 Claims, 7 Drawing Sheets

(56) References Cited

U.S. PATENT DOCUMENTS

2014/0111252 A1* 4/2014 Zhuo .................. H03D 7/12
327/109
2020/0098823 A1 3/2020 Yu et al.

* cited by examiner

BIAS GENERATION CIRCUIT AND BUFFER CIRCUIT INCLUDING THE SAME

CROSS-REFERENCES TO RELATED APPLICATION

The present application claims priority under 35 U.S.C. § 119 (a) to Korean application number 10-2023-0071617, filed on Jun. 2, 2023, in the Korean Intellectual Property Office, which is incorporated herein by reference in its entirety.

BACKGROUND

1. Technical Field

The present disclosure relates to a semiconductor circuit, and particularly, to a bias generation circuit and a buffer circuit including the same.

2. Related Art

A semiconductor apparatus uses a plurality of buffer circuits for the input/output of various signals, such as data and clock signals. An operation of the buffer circuit is affected by temperature, a power supply voltage, and an operating frequency. The buffer circuit requires a bias circuit for a safe operation, and the bias circuit is a very important factor in the semiconductor apparatus.

An increase in internal temperature and a change in external temperature have an adverse influence on the performance of the bias circuit. Accordingly, it is required to develop a bias circuit capable of satisfying both high-speed operation characteristics and low power characteristics while being insensitive to temperature characteristics.

SUMMARY

A bias generation circuit in accordance with an embodiment of the present disclosure may include: a control unit configured to generate two or more control signals in response to frequency information; a reference voltage generation unit configured to generate a first preliminary reference voltage and a second preliminary reference voltage; an amplification section configured to compare a first reference voltage and a second reference voltage with a feedback voltage and configured to output a result as a comparison signal; a voltage selection section configured to, in response to a first control signal, among the two or more control signals, selectively output the first preliminary reference voltage and the second preliminary reference voltage as the first reference voltage and the second reference voltage; and an output section configured to adjust a first current amount according to the comparison signal and configured to output a voltage corresponding to the first current amount as a bias voltage.

A bias generation circuit in accordance with an embodiment of the present disclosure may include: a control unit configured to generate two or more control signals in response to frequency information; a reference voltage generation unit configured to generate a first reference voltage and a second reference voltage; an amplification section configured to compare the first reference voltage and the second reference voltage with a feedback voltage and configured to output a result as a comparison signal; a feedback voltage adjustment section configured to, in response to a first control signal, among the two or more control signals, adjust a slope of the feedback voltage relative to a change in temperature; and an output section configured to adjust a first current amount according to the comparison signal and configured to output a voltage corresponding to the first current amount as a bias voltage.

A bias generation circuit in accordance with an embodiment of the present disclosure may include: a control unit configured to generate two or more control signals in response to frequency information; a reference voltage generation unit configured to generate a first preliminary reference voltage and a second preliminary reference voltage; an amplification section configured to compare a first reference voltage and a second reference voltage with a feedback voltage and configured to output a result as a comparison signal; a voltage selection section configured to, in response to a first control signal, among the two or more control signals, selectively output the first preliminary reference voltage and the second preliminary reference voltage as the first reference voltage and the second reference voltage; a feedback voltage adjustment section configured to, in response to a second control signal, among the two or more control signals, adjust a slope of the feedback voltage relative to a change in temperature; and an output section configured to adjust a first current amount according to the comparison signal and configured to output a voltage corresponding to the first current amount as a bias voltage.

A buffer circuit in accordance with an embodiment of the present disclosure may include: a buffer unit configured to receive an input signal according to a bias voltage and generate an output signal; a reference voltage generation unit configured to generate a first preliminary reference voltage having a level increasing in proportion to an increase in temperature and a second preliminary reference voltage having a constant level regardless of a change in temperature; a control unit configured to generate two or more control signals in response to a level of the output signal and frequency information; and a bias voltage adjustment unit configured to generate the bias voltage in response to at least one of the first preliminary reference voltage and the second preliminary reference voltage and configured to control a level change of the bias voltage in response to the two or more control signals.

DETAILED DESCRIPTION

Hereinafter, embodiments of the present disclosure will be described in more detail with reference to the accompanying drawings.

Various embodiments are directed to providing a bias generation circuit capable of satisfying both high-speed operation characteristics and low power characteristics while being insensitive to temperature characteristics and a buffer circuit including the same.

Figure 1:
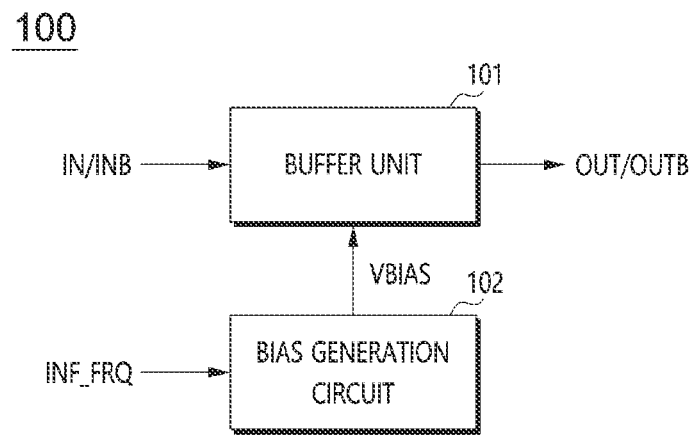
FIG. 1 is a diagram illustrating the configuration of a buffer circuit in accordance with an embodiment of the present disclosure.

FIG. 1 is a diagram illustrating the configuration of a buffer circuit 100 in accordance with an embodiment of the present disclosure.

Referring to FIG. 1, the buffer circuit 100 may include a buffer unit 101 and a bias generation circuit 102.

The buffer unit 101 may receive input signals IN/INB and a bias voltage VBIAS and may generate output signals OUT/OUTB. The buffer unit 101 may receive the input signals IN/INB according to the bias voltage VBIAS and may generate the output signals OUT/OUTB. The buffer unit 101 may adjust the slopes of the output signals OUT/OUTB by adjusting the amount of a bias current IBIAS according to the bias voltage VBIAS.

The bias generation circuit 102 may receive frequency information INF_FRQ and may generate the bias voltage VBIAS. The bias generation circuit 102 may adjust the slope of the bias voltage VBIAS according to the frequency information INF_FRQ.

The frequency information INF_FRQ may include information regarding whether the operating frequency of a semiconductor device employing the buffer circuit 100 is higher or lower than a preset reference value. For example, the frequency information INF_FRQ may include information defining a high frequency when the operating frequency of the semiconductor device is equal to or greater than the reference value and a low frequency when the operating frequency is less than the reference value.

Figure 2:
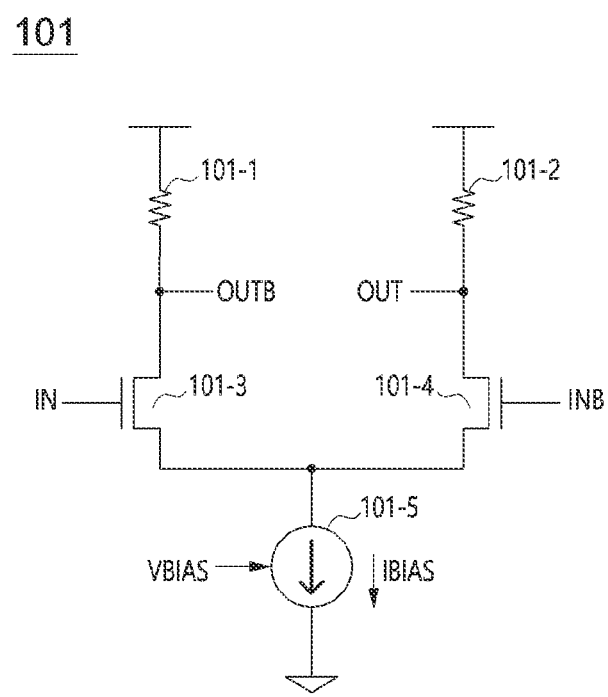
FIG. 2 is a diagram illustrating the configuration of a buffer unit of FIG. 1.

FIG. 2 is a diagram illustrating the configuration of the buffer unit 101 of FIG. 1.

Referring to FIG. 2, the buffer unit 101 may include a first resistor 101-1, a second resistor 101-2, a first transistor 101-3, a second transistor 101-4, and a current source 101-5. One end of each of the first resistor 101-1 and the second resistor 101-2 may be connected to a power supply terminal. The first transistor 101-3 may have a drain terminal connected to the other end of the first resistor 101-1, a source terminal connected to the current source 101-5, and a gate terminal receiving the input signal IN. The second transistor 101-4 may have a drain terminal connected to the other end of the second resistor 101-2, a source terminal connected to the current source 101-5, and a gate terminal receiving the input signal INB. The output signal OUTB may be generated at a node between the first resistor 101-1 and the first transistor 101-3, and the output signal OUT may be generated at a node between the second resistor 101-2 and the second transistor 101-4. The current source 101-5 may adjust the amount of the bias current IBIAS according to the bias voltage VBIAS.

Figure 3:
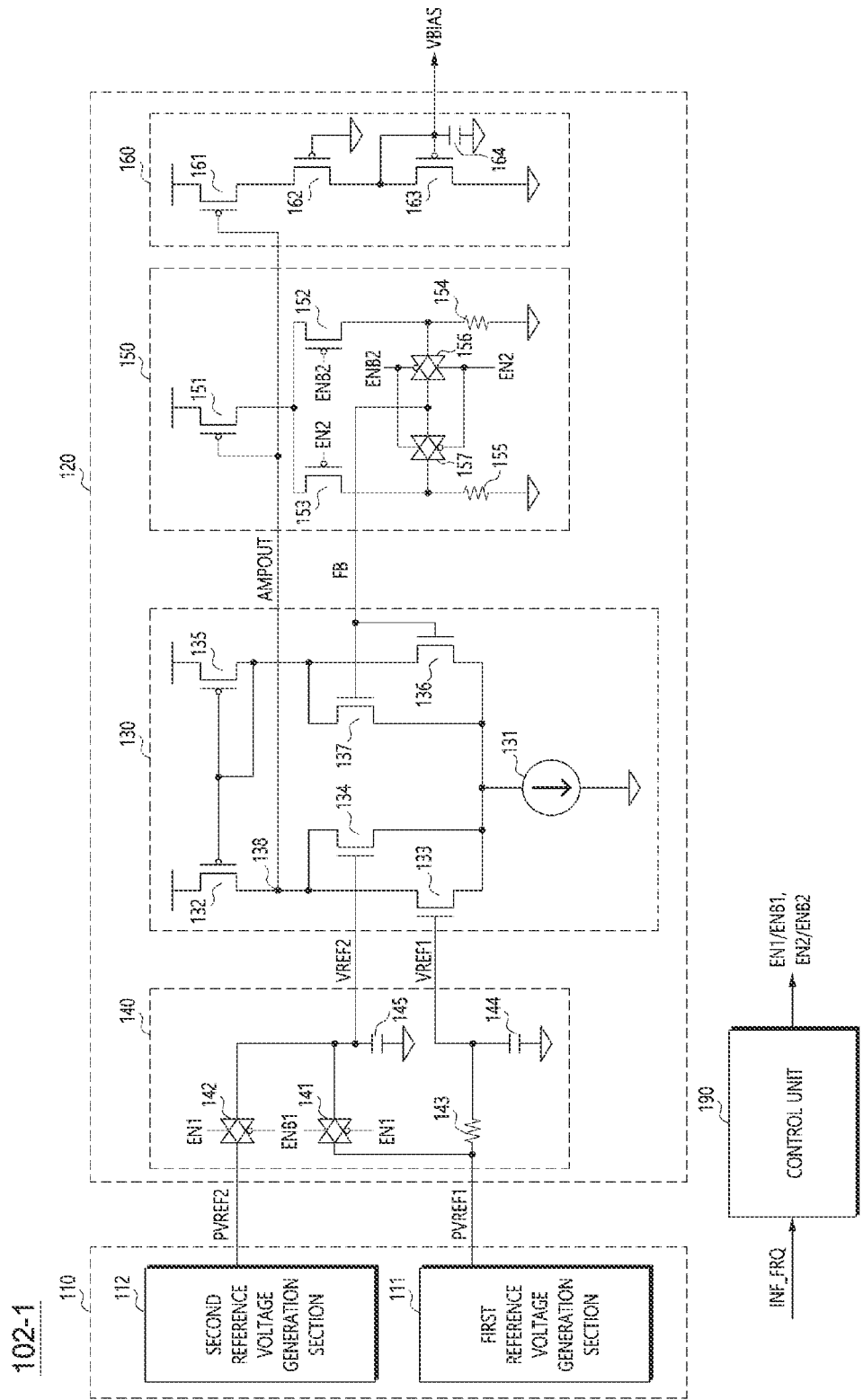
FIG. 3 is a diagram illustrating the configuration of a bias generation circuit in accordance with an embodiment of the present disclosure.
Figure 4:
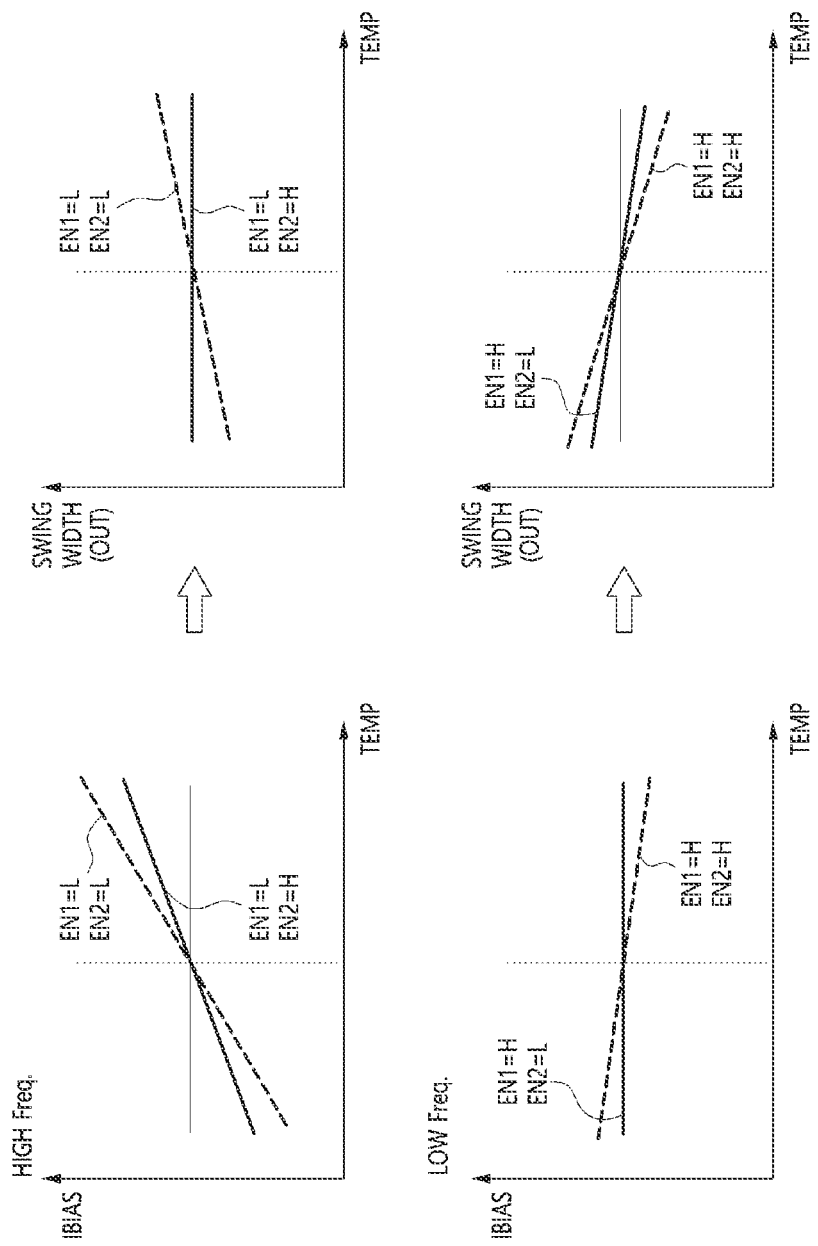
FIG. 4 is a diagram illustrating changes in output characteristics of a buffer circuit employing the bias generation circuit of FIG. 3.

FIG. 3 is a diagram illustrating the configuration of a bias generation circuit 102-1 in accordance with an embodiment of the present disclosure, and FIG. 4 is a diagram illustrating changes in output characteristics of a buffer circuit employing the bias generation circuit 102-1 of FIG. 3.

Hereinafter, with reference to FIGS. 3 and 4, the configuration of the bias generation circuit 102-1 and the operation of the buffer circuit 100 employing the bias generation circuit 102-1 will be described.

Referring to FIG. 3, the bias generation circuit 102-1 may include a reference voltage generation unit 110, a bias voltage adjustment unit 120, and a control unit 190.

The reference voltage generation unit 110 may generate a first preliminary reference voltage PVREF1 and a second preliminary reference voltage PVREF2. The reference voltage generation unit 110 may include a first reference voltage generation section 111 and a second reference voltage generation section 112. The first reference voltage generation section 111 may generate the first preliminary reference voltage PVREF1, the first preliminary reference voltage PVREF1 having a voltage level that increases in proportion to temperature. The second reference voltage generation section 112 may generate the second preliminary reference voltage PVREF2, the second preliminary reference voltage PVREF2 having a constant voltage level regardless of temperature change.

The bias voltage adjustment unit 120 may generate a bias voltage VBIAS in response to at least one of the first preliminary reference voltage PVREF1 and the second preliminary reference voltage PVREF2 and may control the voltage level change of the bias voltage VBIAS in response to a first control signal pair EN1/ENB1 and a second control signal pair EN2/ENB2.

The bias voltage adjustment unit 120 may include an amplification section 130 and an output section 160 and may further include at least one of a voltage selection section 140 and a feedback voltage adjustment section 150.

The amplification section 130 may receive a first reference voltage VREF1, a second reference voltage VREF2, and a feedback voltage FB and may output a comparison signal AMPOUT. The amplification section 130 may compare the first reference voltage VREF1 and the second reference voltage VREF2 with the feedback voltage FB and may output a result as the comparison signal AMPOUT.

The amplification section 130 may include a current source 131 and first to sixth transistors 132 to 137. The current source 131 may be connected to a ground terminal. The first transistor 132 may have a source terminal connected to a power supply terminal and a drain terminal connected to an output node 138. The second transistor 133 may have a drain terminal connected to the output node 138, a source terminal connected to the current source 131, and a gate terminal receiving the first reference voltage VREF1. The third transistor 134 may have a drain terminal connected to the output node 138, a source terminal connected to the current source 131, and a gate terminal receiving the second reference voltage VREF2. The fourth transistor 135 may have a source terminal connected to the power supply terminal, and a drain terminal and a gate terminal connected in common to the gate terminal of the first transistor 132. The fifth transistor 136 may have a drain terminal connected to the drain terminal of the fourth transistor 135, a source terminal connected to the current source 131, and a gate terminal receiving the feedback voltage FB. The sixth transistor 137 may have a drain terminal connected in common to the drain terminal of the fourth transistor 135 and the drain terminal of the fifth transistor 136, a source terminal connected to the current source 131, and a gate terminal receiving the feedback voltage FB.

The voltage selection section 140 may selectively output the first preliminary reference voltage PVREF1 and the second preliminary reference voltage PVREF2 as the first reference voltage VREF1 and the second reference voltage VREF2 in response to the first control signal pair EN1/ENB1.

The voltage selection section 140 may include a first switch 141 and a second switch 142. The voltage selection section 140 may further include a resistor 143, a first capacitor 144, and a second capacitor 145. The first switch 141 may receive the first preliminary reference voltage PVREF1 through an input terminal thereof, receive the first control signal EN1 through an inverting control terminal thereof, and receive the first control signal ENB1 through a non-inverting control terminal thereof. The second switch 142 may receive the second preliminary reference voltage PVREF2 through an input terminal thereof, receive the first control signal EN1 through a non-inverting control terminal thereof, and receive the first control signal ENB1 through an inverting control terminal thereof. One end of the resistor 143 may be connected to an output terminal of the first reference voltage generation section 111. The first capacitor 144 may have one end connected to the ground terminal and the other end connected in common to the amplification section 130 and the other end of the resistor 143. The second capacitor 145 may have one end connected to the ground terminal and the other end connected in common to the amplification section 130, an output terminal of the first switch 141, and an output terminal of the second switch 142.

The voltage selection section 140 may output the first preliminary reference voltage PVREF1 as the first reference voltage VREF1 and may output the second preliminary reference voltage PVREF2 as the second reference voltage VREF2 in response to an activation of the first control signal pair EN1/ENB1. An activation level of the first control signal pair EN1/ENB1 may vary depending on a circuit design method, and an embodiment of the present disclosure may define activation as EN1=high level/ENB1=low level and may define deactivation as EN1=low level/ENB1=high level. The voltage selection section 140 may output the first preliminary reference voltage PVREF1 as the first reference voltage VREF1 and the second reference voltage VREF2 in response to the deactivation of the first control signal pair EN1/ENB1.

The feedback voltage adjustment section 150 may receive the comparison signal AMPOUT and the second control signal pair EN2/ENB2 and may output the feedback voltage FB. In response to the comparison signal AMPOUT and the second control signal pair EN2/ENB2, the feedback voltage adjustment section 150 may adjust the slope of the feedback voltage FB relative to temperature change.

The feedback voltage adjustment section 150 may include first to third transistors 151 to 153, a first resistor 154, a second resistor 155, a first switch 156, and a second switch 157. The first transistor 151 may have a source terminal connected to the power supply terminal and a gate terminal receiving the comparison signal AMPOUT. The second transistor 152 may have a source terminal connected to a drain terminal of the first transistor 151 and a gate terminal receiving the second control signal ENB2. The third transistor 153 may have a source terminal connected to the drain terminal of the first transistor 151 and a gate terminal receiving the second control signal EN2.

The first resistor 154 and the second resistor 155 may be designed to have different temperature coefficients. That is, as the temperature changes, the first resistor 154 and the second resistor 155 may be designed to have different slopes of changes in a resistance value. The first resistor 154 may have one end connected to a drain terminal of the second transistor 152 and the other end connected to the ground terminal. The second resistor 155 may have one end connected to a drain terminal of the third transistor 153 and the other end connected to the ground terminal. A voltage induced at both ends of the first resistor 154 and a voltage induced at both ends of the second resistor 155 may be changed to have different slopes as temperature changes.

The first switch 156 may have an input terminal connected to the first resistor 154, receive the second control signal EN2 through a non-inverting control terminal thereof, and receive the second control signal ENB2 through an inverting control terminal thereof. The second switch 157 may have an input terminal connected to the second resistor 155, receive the second control signal EN2 through an inverting control terminal thereof, and receive the second control signal ENB2 through a non-inverting control terminal thereof.

When the second control signal pair EN2/ENB2 is activated, the feedback voltage adjustment section 150 may output, as the feedback voltage FB, the voltage induced at both ends of the first resistor 154 because the second transistor 152 and the first switch 156 are activated. When the second control signal pair EN2/ENB2 is deactivated, the feedback voltage adjustment section 150 may output, as the feedback voltage FB, the voltage induced at both ends of the second resistor 155 because the third transistor 153 and the second switch 157 are activated. An activation level of the second control signal pair EN2/ENB2 may vary depending on a circuit design method, and an embodiment of the present disclosure may define activation as EN2=high level/ENB2=low level and deactivation as EN2=low level/ENB2=high level.

The output section 160 may receive the comparison signal AMPOUT and may output the bias voltage VBIAS. The output section 160 may adjust a first current amount according to the comparison signal AMPOUT and may output a voltage corresponding to the first current amount as the bias voltage VBIAS.

The output section 160 may include first to third transistors 161 to 163 and a capacitor 164. The first transistor 161 may have a source terminal connected to the power supply terminal and a gate terminal receiving the comparison signal AMPOUT. The second transistor 162 may have a source terminal connected to a drain terminal of the first transistor 161 and a gate terminal connected to the ground terminal. The third transistor 163 may have a drain terminal connected to a drain terminal of the second transistor 162, a source terminal connected to the ground terminal, and a gate terminal connected to its own drain terminal. The capacitor 164 may have one end connected to the ground terminal and the other end connected in common to the gate terminal and the drain terminal of the third transistor 163. A voltage charged in the capacitor 164 may be output as the bias voltage VBIAS.

The control unit 190 may generate the first control signal pair EN1/ENB1 and the second control signal pair EN2/ENB2 in response to frequency information INF_FRQ. The control unit 190 may determine whether the operating frequency of the semiconductor device employing the buffer circuit 100 is high (above a reference value) or low (less than the reference value) according to the frequency information INF_FRQ.

When the operating frequency of the semiconductor device is high, a stable operation of the semiconductor device is important. To this end, swing widths of the output signals OUT/OUTB of the buffer circuit 100 need to be constantly maintained by increasing a bias current IBIAS. On the other hand, when the operating frequency of the semiconductor device is low, even though the swing widths of the output signals OUT/OUTB of the buffer circuit 100 are reduced, it is important to reduce the current consumption because a stable operation of the semiconductor device is secured against high frequencies. To this end, an increase in current consumption needs to be prevented by constantly maintaining the bias current IBIAS. Accordingly, the control unit 190 may control at least one value of the first control signal pair EN1/ENB1 and the second control signal pair EN2/ENB2 to satisfy the high/low frequency conditions according to the frequency information INF_FRQ.

For example, as illustrated in FIG. 4, under high frequency conditions HIGH Freq, the control unit 190 may increase the bias current IBIAS by setting EN1 and EN2 to a low level (EN1=EN2=L), thereby constantly maintaining the swing widths of the output signals OUT/OUTB of the buffer circuit 100 regardless of the change in temperature. Under low frequency conditions LOW Freq, the control unit 190 may constantly maintain the bias current IBIAS by setting EN1 and EN2 to a high level (EN1=EN2=H), thereby reducing current consumption.

The embodiment, according to FIG. 3, described above, is merely an example in which the bias voltage adjustment unit 120 includes the amplification section 130, the output section 160, the voltage selection section 140, and the feedback voltage adjustment section 150. The bias voltage adjustment unit 120 may be configured such that the feedback voltage adjustment section 150 includes only the first transistor 151 and a resistor connected in series to the first transistor 151 and may output a voltage induced at both ends of the resistor as the feedback voltage FB. In such a case, the configuration of the control unit 190 may be changed to generate only the first control signal pair EN1/ENB1.

The bias voltage adjustment unit 120 may also be configured such that the voltage selection section 140 is removed and the first preliminary reference voltage PVREF1 and the second preliminary reference voltage PVREF2 are directly provided to the amplification section 130 as the first reference voltage VREF1 and the second reference voltage VREF2, respectively. In such a case, the configuration of the control unit 190 may be changed to generate only the second control signal pair EN2/ENB2.

Figure 5:
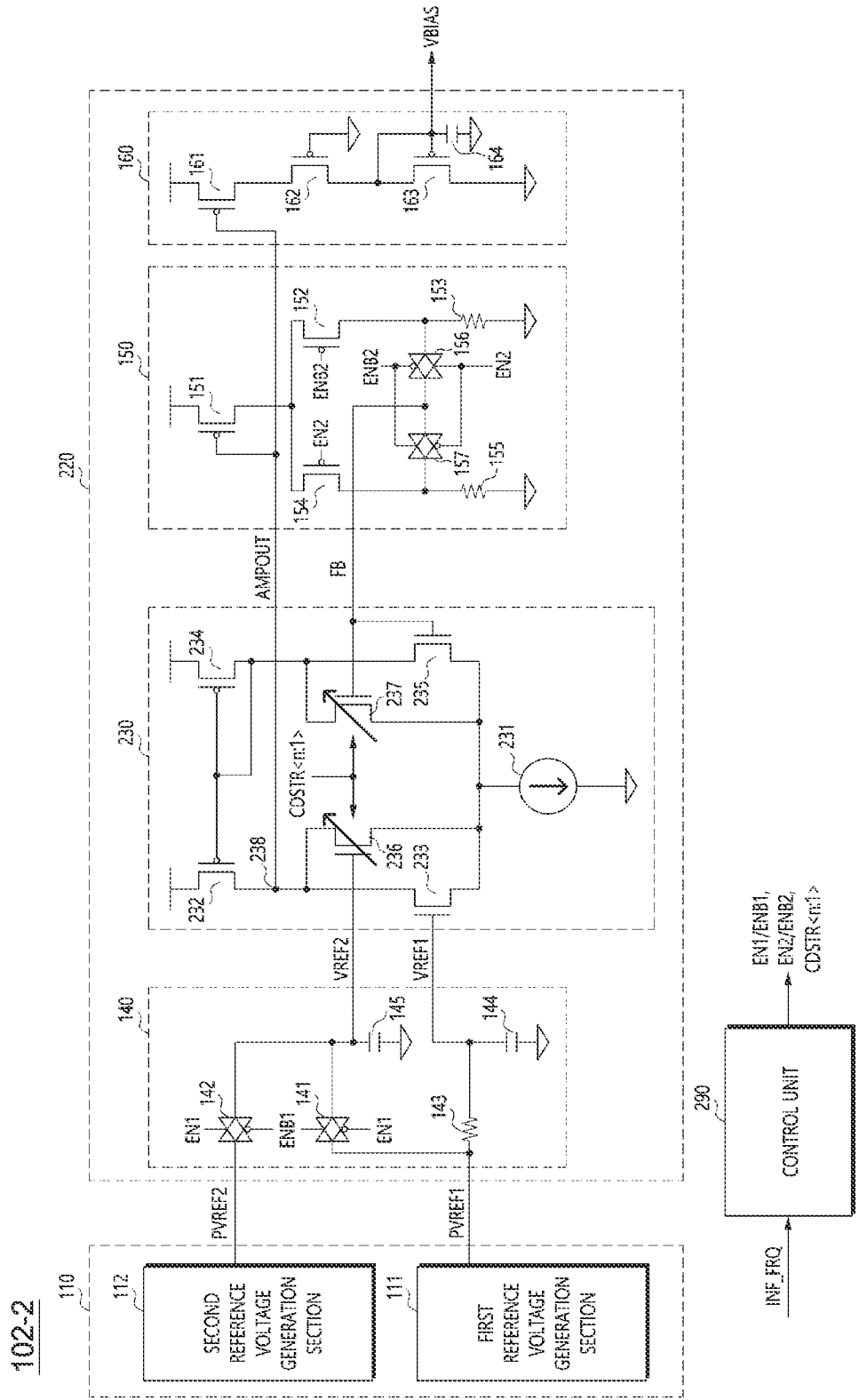
FIG. 5 is a diagram illustrating the configuration of a bias generation circuit in accordance with another embodiment of the present disclosure.
Figure 6:
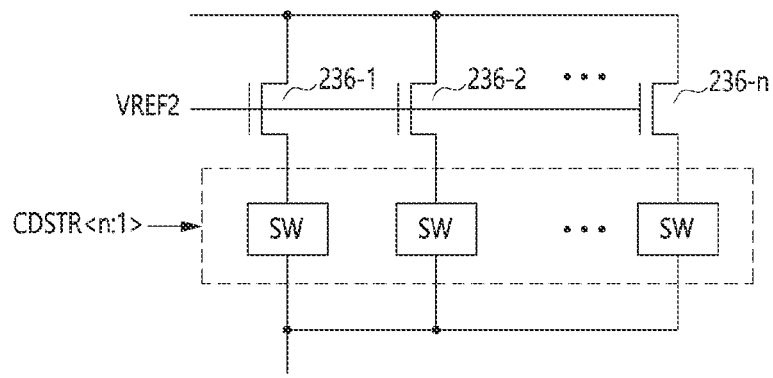
FIG. 6 is a diagram illustrating the configuration of a first drivability variable part and a second drivability variable part of FIG. 5.
Figure 6:
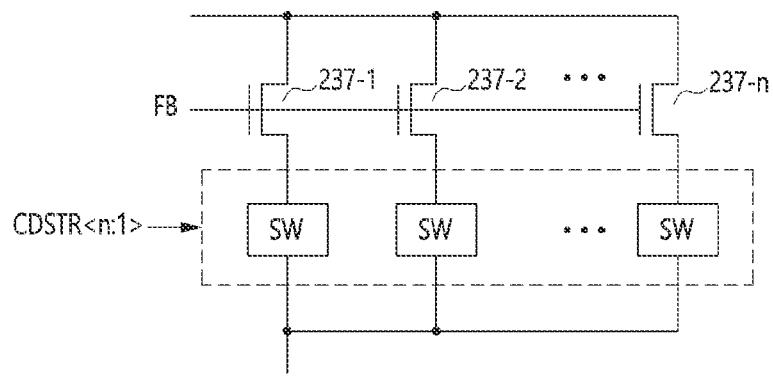
Figure 7:
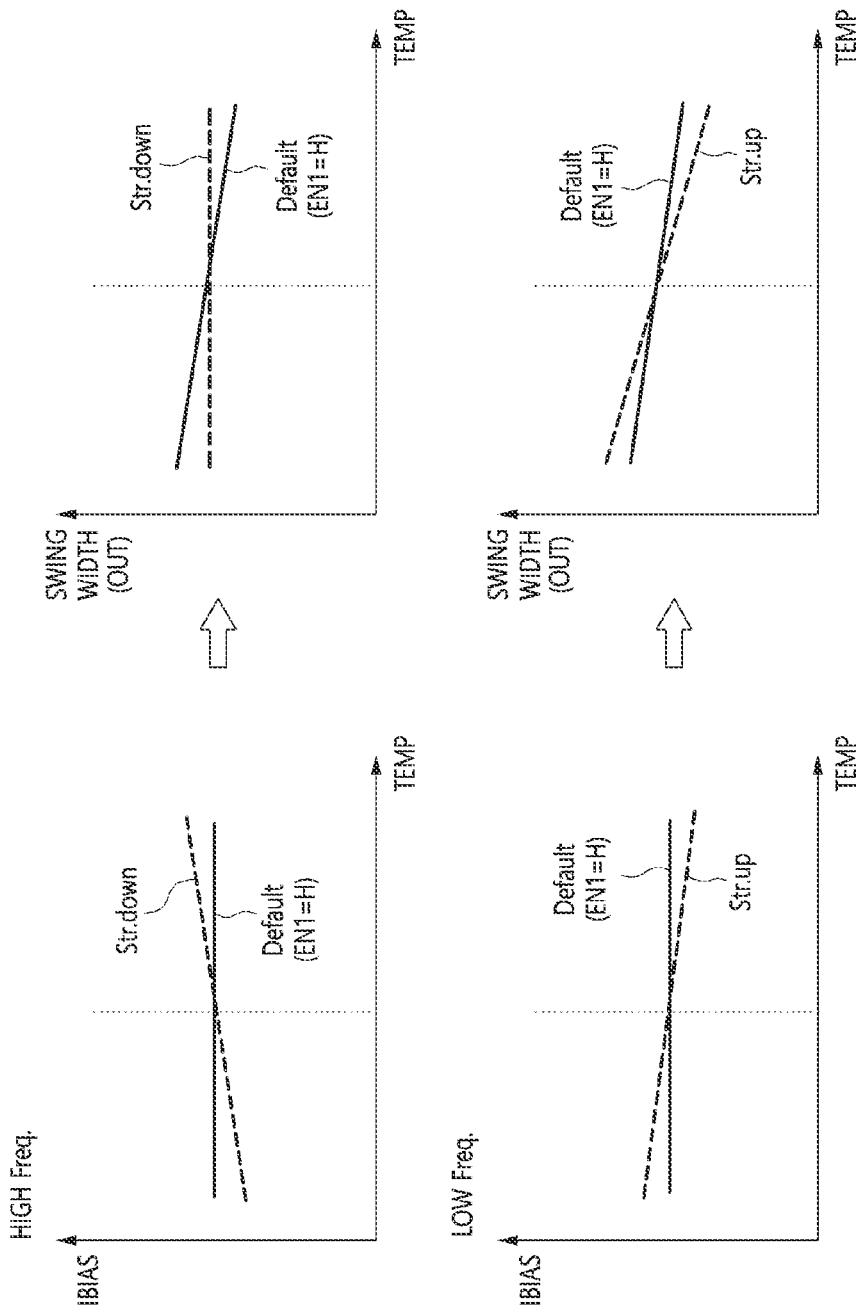
FIG. 7 is a diagram illustrating changes in output characteristics of a buffer circuit employing the bias generation circuit of FIG. 5.

FIG. 5 is a diagram illustrating the configuration of a bias generation circuit 102-2 in accordance with another embodiment of the present disclosure, FIG. 6 is a diagram illustrating the configuration of a first drivability variable part 236 and a second drivability variable part 237 of FIG. 5, and FIG. 7 is a diagram illustrating changes in output characteristics of the buffer circuit 100 employing the bias generation circuit 102-2 of FIG. 5.

Hereinafter, with reference to FIGS. 5 to 7, the configuration of the bias generation circuit 102-2 and the operation of the buffer circuit 100 including the bias generation circuit 102-2 will be described.

Referring to FIG. 5, the bias generation circuit 102-2 may include the reference voltage generation unit 110, a bias voltage adjustment unit 220, and a control unit 290.

Since the reference voltage generation unit 110, the voltage selection section 140, the feedback voltage adjustment section 150, and the output section 160 may be configured in the same manner as in FIG. 3, description thereof will be omitted.

The bias voltage adjustment unit 220 may generate the bias voltage VBIAS in response to at least one of the first preliminary reference voltage PVREF1 and the second preliminary reference voltage PVREF2 and may control the voltage level change of the bias voltage VBIAS in response to the first control signal pair EN1/ENB1, the second control signal pair EN2/ENB2, and a third control signal CDSTR<n:1>.

The bias voltage adjustment unit 220 may include an amplification section 230 and an output section 160 and may further include at least one of the voltage selection section 140 and the feedback voltage adjustment section 150.

The amplification section 230 may receive the third control signal CDSTR<n:1>, the first reference voltage VREF1, the second reference voltage VREF2, and the feedback voltage FB and may output a comparison signal AMPOUT. The amplification section 230 may compare the first reference voltage VREF1 and the second reference voltage VREF2 with the feedback voltage FB and may output a result as the comparison signal AMPOUT. In the amplification section 230, the current drivability corresponding to at least one of the first reference voltage VREF1, the second reference voltage VREF2, and the feedback voltage FB may be varied according to the third control signal CDSTR<n:1>, and as the current drivability is varied, the slope of the comparison signal AMPOUT relative to temperature change may be varied. FIG. 5 is an example in which the amplification section 230 is configured such that the current drivability corresponding to each of the second reference voltage VREF2 and the feedback voltage FB is varied according to the third control signal CDSTR<n:1>.

The amplification section 230 may include a current source 231, first to fourth transistors 232 to 235, a first drivability variable part 236, and a second drivability variable part 237. The current source 231 may be connected to the ground terminal. The first transistor 232 may have a source terminal connected to the power supply terminal and a drain terminal connected to an output node 238. The second transistor 233 may have a drain terminal connected to the output node 238, a source terminal connected to the current source 231, and a gate terminal receiving the first reference voltage VREF1. The third transistor 234 may have a source terminal connected to the power supply terminal and a drain terminal and a gate terminal connected in common to the gate terminal of the first transistor 232. The fourth transistor 235 may have a drain terminal connected to the drain terminal of the third transistor 234, a source terminal connected to the current source 231, and a gate terminal receiving the feedback voltage FB. The first drivability variable part 236 may have a drain terminal connected to the output node 238, a source terminal connected to the current source 231, and a gate terminal receiving the second reference voltage VREF2. The first drivability variable part 236 may vary the current drivability corresponding to the second reference voltage VREF2 according to the third control signal CDSTR<n:1>. The second drivability variable part 237 may have a drain terminal connected in common to the drain terminal of the third transistor 234 and the drain terminal of the fourth transistor 235, a source terminal connected to the current source 231, and a gate terminal receiving the feedback voltage FB. The second drivability variable part 237 may vary the current drivability corresponding to the feedback voltage FB according to the third control signal CDSTR<n:1>. The first drivability variable part 236 may be configured to be identical to the second drivability variable part 237.

The control unit 290 may generate the first control signal pair EN1/ENB1, the second control signal pair EN2/ENB2, and the third control signal CDSTR<n:1> in response to frequency information INF_FRQ. The third control signal CDSTR<n:1> may have a value for selecting at least one of a plurality of selection targets.

Referring to FIG. 6, the first drivability variable part 236 may include a plurality of transistors 236-1 to 236-n and a plurality of switches SW. The plurality of transistors 236-1 to 236-n may have drain terminals connected in common to one another and may receive the second reference voltage VREF2 in common through gate terminals thereof. The plurality of transistors 236-1 to 236-n may be designed to have different current drivability or to have the same drivability. The plurality of switches SW may be connected to source terminals of the plurality of transistors 236-1 to 236-n, respectively. The plurality of switches SW may be activated according to each signal bit of the third control signal CDSTR<n:1>. The current drivability may be varied by controlling the value of the third control signal CDSTR<n:1> in a different way according to a design method of the plurality of transistors 236-1 to 236-n described above. The second drivability variable part 237 may include a plurality of transistors 237-1 to 237-n and a plurality of switches SW. The plurality of transistors 237-1 to 237-n may have drain terminals connected in common to one another and may receive the feedback voltage FB in common through gate terminals thereof. The plurality of transistors 237-1 to 237-n may be designed to have different current drivability or to have the same drivability. The plurality of switches SW may be connected to source terminals of the plurality of transistors 237-1 to 237-n, respectively. The plurality of switches SW may be activated according to each signal bit of the third control signal CDSTR<n:1>. The current drivability may be varied by controlling the value of the third control signal CDSTR<n:1> in a different way according to a design method of the plurality of transistors 237-1 to 237-n described above.

As mentioned above, when the operating frequency of the semiconductor device is high, the swing widths of the output signals OUT/OUTB of the buffer circuit 100 need to be constantly maintained by increasing the bias current IBIAS. Meanwhile, when the operating frequency of the semiconductor device is low, an increase in current consumption needs to be prevented by constantly maintaining the bias current IBIAS. Accordingly, the control unit 290 may control at least one value of the first control signal pair EN1/ENB1, the second control signal pair EN2/ENB2, and the third control signal CDSTR<n:1> to satisfy the high/low frequency conditions according to the frequency information INF_FRQ.

For example, as illustrated in FIG. 7, under the high frequency conditions HIGH Freq, the control unit 290 may decrease the current drivability by controlling the value of the third control signal CDSTR<n:1> while maintaining the first control signal EN1 at a high level (see Str. down). Since the current drivability is decreased, the control unit 290 may constantly maintain the swing widths of the output signals OUT/OUTB of the buffer circuit 100 regardless of the change in temperature by increasing the bias current IBIAS according to an increase in temperature. Under the low frequency conditions LOW Freq, the control unit 290 may increase the current drivability by controlling the value of the third control signal CDSTR<n:1> while maintaining the first control signal EN1 at a high level (see Str. up). Since the current drivability is increased, the control unit 290 may decrease current consumption by decreasing the bias current IBIAS as the temperature increases.

Figure 8:
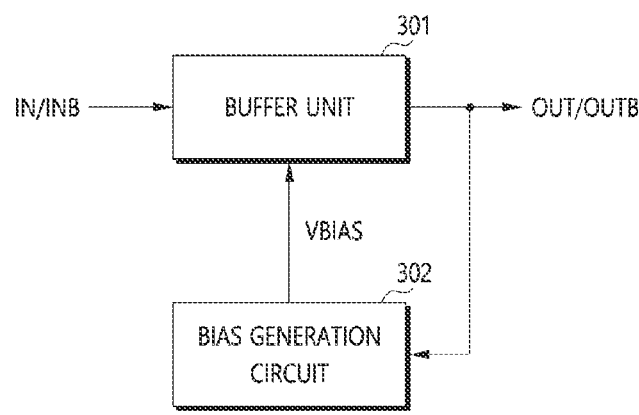
FIG. 8 is a diagram illustrating the configuration of a buffer circuit in accordance with another embodiment of the present disclosure.

FIG. 8 is a diagram illustrating the configuration of a buffer circuit 300 in accordance with another embodiment of the present disclosure.

Referring to FIG. 8, the buffer circuit 300 may include a buffer unit 301 and a bias generation circuit 302.

The buffer unit 301 may receive the input signals IN/INB and the bias voltage VBIAS and may generate the output signals OUT/OUTB. The buffer unit 301 may receive the input signals IN/INB according to the bias voltage VBIAS and may generate the output signals OUT/OUTB. The buffer unit 301 may adjust the slopes of the output signals OUT/OUTB by adjusting the amount of the bias current IBIAS according to the bias voltage VBIAS. The buffer unit 301 may have the same configuration as that of FIG. 2.

The bias generation circuit 302 may receive the output signals OUT/OUTB of the buffer unit 301 and may generate the bias voltage VBIAS. The bias generation circuit 302 may adjust the slope of the bias voltage VBIAS according to the level change of the output signals OUT/OUTB.

Figure 9:
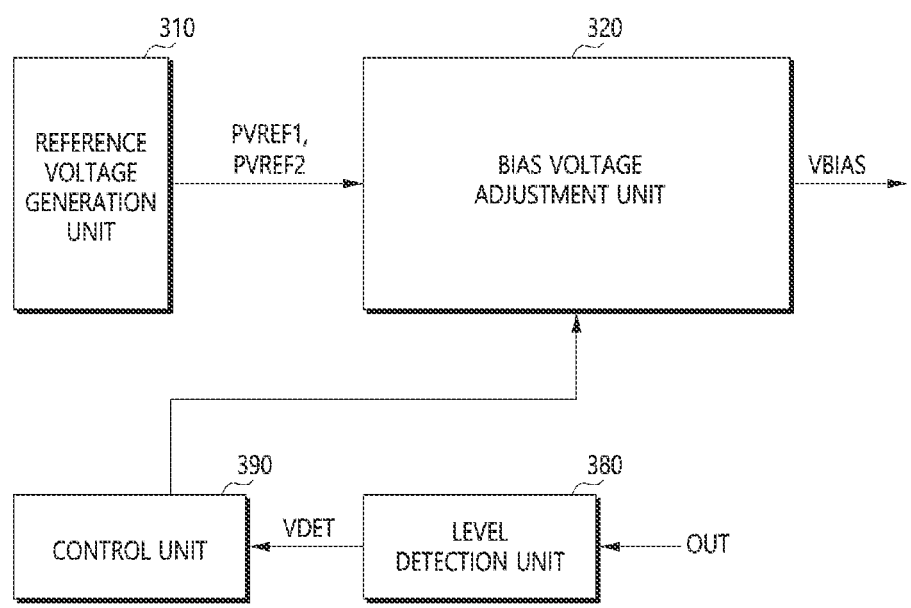
FIG. 9 is a diagram illustrating the configuration of a bias generation circuit of FIG. 8.

FIG. 9 is a diagram illustrating the configuration of the bias generation circuit 302 of FIG. 8.

Referring to FIG. 9, the bias generation circuit 302 in accordance with another embodiment of the present disclosure may include a reference voltage generation unit 310, a bias voltage adjustment unit 320, a level detection unit 380, and a control unit 390.

The reference voltage generation unit 310 may generate the first preliminary reference voltage PVREF1 and the second preliminary reference voltage PVREF2. The reference voltage generation unit 310 may have the same configuration as the reference voltage generation unit 110 of FIG. 3.

The bias voltage adjustment unit 320 may have the same configuration as the bias voltage adjustment unit 120 of FIG. 3 or the same configuration as the bias voltage adjustment unit 220 of FIG. 5.

The level detection unit 380 may detect the levels of the output signals OUT/OUTB of the buffer unit 301 and may generate a level detection signal VDET.

The control unit 390 may determine the level change of the output signals OUT/OUTB of the buffer unit 301 according to the level detection signal VDET and may generate control signals according to the determination result, for example, the first control signal pair EN1/ENB1, the second control signal pair EN2/ENB2, and the third control signal CDSTR<n:1> described above with reference to FIG. 5.

The control unit 390 may determine whether the voltage levels of the output signals OUT/OUTB of the buffer unit 301 are lower/higher than a target level, or the range of variation of the levels of the output signals OUT/OUTB of the buffer unit 301 exceeds a preset reference value and may control values of the first control signal pair EN1/ENB1, the second control signal pair EN2/ENB2, and the third control signal CDSTR<n:1> so that the bias current IBIAS is increased or decreased according to the determination result.

A person skilled in the art to which the present disclosure pertains can understand that the present disclosure may be carried out in other specific forms without changing its technical spirit or essential features. Therefore, it should be understood that the embodiments described above are illustrative in all aspects, not limitative. The scope of the present disclosure is defined by the claims to be described below rather than the detailed description, and it should be construed that all changes or modified forms derived from the meaning and scope of the claims and the equivalent concept thereof are included in the scope of the present disclosure.

What is claimed is:

1. A bias generation circuit comprising:
a control unit configured to generate two or more control signals in response to frequency information;
a reference voltage generation unit configured to generate a first preliminary reference voltage and a second preliminary reference voltage;
an amplification section configured to compare a first reference voltage and a second reference voltage with a feedback voltage and configured to output a result as a comparison signal;
a voltage selection section configured to, in response to a first control signal, among the two or more control signals, selectively output the first preliminary reference voltage and the second preliminary reference voltage as the first reference voltage and the second reference voltage; and
an output section configured to adjust a first current amount according to the comparison signal and configured to output a voltage corresponding to the first current amount as a bias voltage,
wherein the reference voltage generation unit comprises:
a first reference voltage generation section configured to generate the first preliminary reference voltage having a level increasing in proportion to an increase in temperature; and
a second reference voltage generation section configured to generate the second preliminary reference voltage having a constant level regardless of a change in temperature.

2. The bias generation circuit according to claim 1, wherein, in response to an activation of the first control signal, the voltage selection section is configured to output the first preliminary reference voltage as the first reference voltage and configured to output the second preliminary reference voltage as the second reference voltage.

3. The bias generation circuit according to claim 2, wherein, in response to a deactivation of the first control signal, the voltage selection section is configured to output the first preliminary reference voltage as the first reference voltage and the second reference voltage.

4. The bias generation circuit according to claim 1, wherein, in response to a second control signal, among the two or more control signals, the amplification section is configured to vary current drivability corresponding to at least one of the first reference voltage, the second reference voltage, and the feedback voltage.

5. The bias generation circuit according to claim 1, wherein the amplification section comprises:
a first drivability variable part configured to vary current drivability corresponding to the second reference voltage according to a second control signal; and
a second drivability variable part configured to vary current drivability corresponding to the feedback voltage according to the second control signal.

6. A bias generation circuit comprising:
a control unit configured to generate two or more control signals in response to frequency information;
a reference voltage generation unit configured to generate a first reference voltage and a second reference voltage;
an amplification section configured to compare the first reference voltage and the second reference voltage with a feedback voltage and configured to output a result as a comparison signal;
a feedback voltage adjustment section configured to, in response to a first control signal, among the two or more control signals, adjust a slope of the feedback voltage relative to a change in temperature; and
an output section configured to adjust a first current amount according to the comparison signal and configured to output a voltage corresponding to the first current amount as a bias voltage,
wherein the reference voltage generation unit comprises:
a first reference voltage generation section configured to generate a first preliminary reference voltage having a level increasing in proportion to an increase in temperature; and
a second reference voltage generation section configured to generate a second preliminary reference voltage having a constant level regardless of a change in temperature.

7. The bias generation circuit according to claim 6, wherein, in response to a second control signal, among the two or more control signals, the amplification section is configured to vary current drivability corresponding to at least one of the first reference voltage, the second reference voltage, and the feedback voltage.

8. The bias generation circuit according to claim 6, wherein the feedback voltage adjustment section includes a first resistor and a second resistor having different temperature coefficients, the feedback voltage adjustment section configured to generate, as the feedback voltage, a voltage induced at both ends of the first resistor in response to an activation of the first control signal and configured to generate, as the feedback voltage, a voltage induced at both ends of the second resistor in response to a deactivation of the first control signal.

9. A bias generation circuit comprising:
a control unit configured to generate two or more control signals in response to frequency information;
a reference voltage generation unit configured to generate a first preliminary reference voltage and a second preliminary reference voltage;
an amplification section configured to compare a first reference voltage and a second reference voltage with a feedback voltage and configured to output a result as a comparison signal;
a voltage selection section configured to, in response to a first control signal, among the two or more control signals, selectively output the first preliminary reference voltage and the second preliminary reference voltage as the first reference voltage and the second reference voltage;
a feedback voltage adjustment section configured to, in response to a second control signal, among the two or more control signals, adjust a slope of the feedback voltage relative to a change in temperature; and
an output section configured to adjust a first current amount according to the comparison signal and configured to output a voltage corresponding to the first current amount as a bias voltage,
wherein, in response to a third control signal, among the two or more control signals, the amplification section is configured to vary current drivability corresponding to at least one of the first reference voltage and the second reference voltage.

10. The bias generation circuit according to claim 9, wherein the voltage selection section is configured to output the first preliminary reference voltage as the first reference voltage and output the second preliminary reference voltage as the second reference voltage in response to an activation of the first control signal and configured to output the first preliminary reference voltage as the first reference voltage and the second reference voltage in response to a deactivation of the first control signal.

11. A buffer circuit comprising:
a buffer unit configured to receive an input signal according to a bias voltage and generate an output signal;
a reference voltage generation unit configured to generate a first preliminary reference voltage having a level increasing in proportion to an increase in temperature and a second preliminary reference voltage having a constant level regardless of a change in temperature;
a control unit configured to generate two or more control signals in response to a level of the output signal and frequency information; and
a bias voltage adjustment unit configured to generate the bias voltage in response to at least one of the first preliminary reference voltage and the second preliminary reference voltage and configured to control a level change of the bias voltage in response to the two or more control signals.

12. The buffer circuit according to claim 11, wherein the bias voltage adjustment unit comprises:
an amplification section configured to compare a first reference voltage and a second reference voltage with a feedback voltage and configured to output a result as a comparison signal;
a voltage selection section configured to, in response to a first control signal, among the two or more control signals, selectively output the first preliminary reference voltage and the second preliminary reference voltage as the first reference voltage and the second reference voltage; and
an output section configured to adjust a first current amount according to a comparison signal and configured to output a voltage corresponding to the first current amount as the bias voltage.

13. The buffer circuit according to claim 12, further comprising:
a feedback voltage adjustment section configured to, in response to a second control signal, among the two or more control signals, adjust a slope of the feedback voltage relative to a change in temperature.

14. The buffer circuit according to claim 12, wherein, in response to a third control signal, among the two or more control signals, the amplification section is configured to vary current drivability corresponding to at least one of the first reference voltage, the second reference voltage, and the feedback voltage.

15. The buffer circuit according to claim 11, further comprising:
a level detection unit configured to detect a level of the output signal to generate a level detection signal and configured to provide the level detection signal to the control unit.

* * * * *